United States Patent
Todi et al.

(10) Patent No.: US 8,936,996 B2
(45) Date of Patent: Jan. 20, 2015

(54) STRUCTURE AND METHOD FOR TOPOGRAPHY FREE SOI INTEGRATION

(75) Inventors: Ravi M. Todi, Poughkeepsie, NY (US); Joseph Ervin, Wappingers Falls, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 550 days.

(21) Appl. No.: 12/958,429

(22) Filed: Dec. 2, 2010

(65) Prior Publication Data

US 2012/0139085 A1 Jun. 7, 2012

(51) Int. Cl.
*H01L 21/76* (2006.01)
*H01L 29/02* (2006.01)
*H01L 21/762* (2006.01)

(52) U.S. Cl.
CPC .......... *H01L 29/02* (2013.01); *H01L 21/76254* (2013.01)
USPC ............................ 438/425; 438/439; 438/442

(58) Field of Classification Search
USPC ................... 438/400, 425, 439, 442, 455–459
See application file for complete search history.

(56) References Cited

U.S. PATENT DOCUMENTS

| | | | | |
|---|---|---|---|---|
| 6,013,954 A | * | 1/2000 | Hamajima | 257/797 |
| 2001/0007367 A1 | * | 7/2001 | Ohkubo | 257/347 |
| 2006/0166461 A1 | * | 7/2006 | Fournel et al. | 438/455 |
| 2007/0202660 A1 | * | 8/2007 | Moriceau et al. | 438/424 |
| 2007/0259528 A1 | * | 11/2007 | Moriceau et al. | 438/702 |

OTHER PUBLICATIONS

Quirk, Michael, and Julian Serda. Semiconductor Manufacturing Technology. Upper Saddle River, NJ: Prentice Hall, 2001.*

* cited by examiner

*Primary Examiner* — Mark Tornow
(74) *Attorney, Agent, or Firm* — Scully, Scott, Murphy & Presser, P.C.; H. Daniel Schnurmann

(57) ABSTRACT

A semiconductor structure is provided that includes a semiconductor oxide layer having features. The semiconductor oxide layer having the features is located between an active semiconductor layer and a handle substrate. The semiconductor structure includes a planarized top surface of the active semiconductor layer such that the semiconductor oxide layer is beneath the planarized top surface. The features within the semiconductor oxide layer are mated with a surface of the active semiconductor layer.

9 Claims, 3 Drawing Sheets

STRUCTURE AND METHOD FOR TOPOGRAPHY FREE SOI INTEGRATION

BACKGROUND

The present disclosure relates to a method of manufacturing a semiconductor structure and a resulting semiconductor structure that is formed by the method. More particularly, the present disclosure provides a method of manufacturing a semiconductor-on-insulator (SOI) substrate including a semiconductor oxide layer having features buried between two semiconductor materials.

A semiconductor substrate of a semiconductor chip or semiconductor device may be a semiconductor-on-insulator (SOI) substrate. In some instances, an SOI substrate includes an insulating layer, such as a semiconductor oxide, grown on a conventional semiconductor wafer, followed by growing a semiconductor body to sandwich the insulating layer between two semiconductor materials. The insulating layer may typically be composed of silicon oxide, and the semiconductor wafer and semiconductor body may both be comprised of silicon. In a typical SOI substrate, the insulating layer that is located between the two semiconductor materials has a planar first surface and an opposing planar second surface.

An SOI substrate may also be formed by utilizing a technique such as, for example, SIMOX (Separation by Implanted Oxygen). In a typical SIMOX process, oxygen ions are implanted into a bulk semiconductor wafer. In yet another method of forming an SOI substrate, a layer transfer method, which may include at least one wafer bonding step, can be used.

In the semiconductor industry, research indicates that the conduction speed of an SOI substrate is faster than a conventional bulk semiconductor substrate. A semiconductor device formed on an SOI substrate is preferable in the industry for applications requiring high breakdown voltage. For these and other reasons, SOI devices are sought after in the industry.

It would therefore be desirable to provide a semiconductor-on-insulator substrate which is less susceptible to unwanted exposure and damage during semiconductor processing. Similarly, a method of semiconductor manufacturing is needed to provide the semiconductor-on-insulator substrate described above.

SUMMARY

A semiconductor structure is provided that contains a semiconductor oxide layer including features. By "features" it is meant that one surface of the semiconductor oxide layer is non-planar having recessed regions adjacent to non-recessed regions. The semiconductor oxide layer having the features can be, for example, a silicon oxide layer or a germanium oxide layer.

The semiconductor oxide layer which contains the features is located between an active semiconductor layer and a handle substrate. The active semiconductor layer has a planarized top surface such that the semiconductor oxide layer containing the features is beneath the planarized top surface. In the structure provided, the non-planar surface of the semiconductor oxide layer is in direct contact with the active semiconductor layer.

Specifically, and in one aspect of the present disclosure, a semiconductor structure is provided that includes a semiconductor oxide layer having features located between an active semiconductor layer and a handle substrate. The semiconductor oxide layer having the features includes a non-planar surface in direct contact with a surface of the active semiconductor layer and an opposing planar surface is in direct contact with an upper surface of the handle substrate. The surface of the active semiconductor layer that is in direct contact with the non-planar surface of the semiconductor oxide layer opposes a planar top surface of the active semiconductor layer.

In another aspect of the present disclosure, a method of manufacturing a semiconductor structure is provided. The method of the present disclosure includes forming a semiconductor oxide layer on a top surface of a semiconductor substrate using a first thermal oxidation. The semiconductor oxide layer is patterned to expose portions of the semiconductor substrate. A second thermal oxidation is performed to form a semiconductor oxide layer having features therein. A top surface of the semiconductor oxide layer having the features is then planarized. A handle substrate is bonded to the planarized top surface of the semiconductor oxide layer to form a semiconductor structure. An exposed surface of the semiconductor substrate is then planarized to provide an active semiconductor layer of the semiconductor structure. The semiconductor oxide layer having the features is beneath the planarized top surface of the active semiconductor layer, and the semiconductor oxide layer having the features is located between the active semiconductor layer and the handle substrate. As mentioned above, the semiconductor oxide layer having the features includes a non-planar surface that is in direct contact with a surface of the active semiconductor layer, and a planar surface in direct contact with an upper surface of the handle substrate.

BRIEF DESCRIPTION OF THE DRAWINGS

The features and advantages of the present disclosure will become apparent from the following detailed description of illustrative embodiments thereof, which is to be read in connection with the accompanying drawings. The various features of the drawings are not to scale as the illustrations are for clarity in facilitating one skilled in the art in understanding the disclosure in conjunction with the detailed description. In the drawings.

DETAILED DESCRIPTION

The present disclosure will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to FIGS. 1-9, according to an illustrative embodiment of the present disclosure, a method for processing a semiconductor structure is shown. Specifically, FIGS. 1-9 illustrate a method of manufacturing a semiconductor structure, i.e., a semiconductor-on-insulator substrate, that includes a semiconductor oxide layer having features located between an active semiconductor layer and a handle substrate. The features of the semiconductor substrate, which are represented by a non-planar surface, are mated with a surface of the active semiconductor layer.

Figure 1:
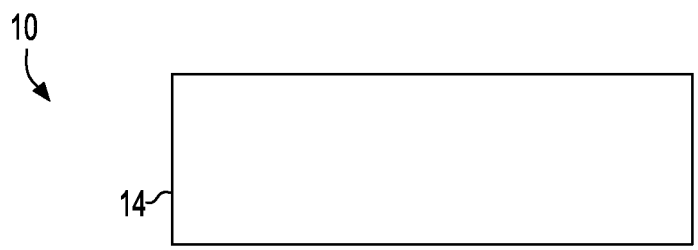
FIG. 1 is a cross sectional side elevational view depicting an initial semiconductor substrate according to the present disclosure.

The method of the present disclosure includes providing an initial structure 10, which includes a semiconductor substrate 14 that may be embodied as a first semiconductor layer, for example, a silicon (Si) wafer or substrate, as in FIG. 1. Alternative embodiments may include a silicon carbon substrate. Still other alternative semiconductor materials for the semiconductor substrate 14 may include SiGe, SiGeC, Ge alloys, GaAs, InAs, InP and other III/V or II/VI compound semiconductors may be used. Alternatively, the semiconductor substrate 14 may also be a layered semiconductor such as, for example, Si/SiGe, Si/SiC, or silicon germanium-on-insulators (SGOIs), as well as, silicon-on-insulators (SOIs). The insulating material can be an organic insulator, an inorganic insulator or a combination thereof including multilayers.

Figure 2:
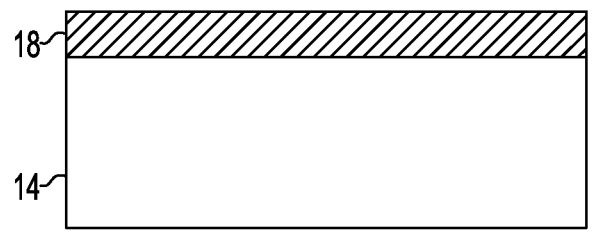
FIG. 2 is a cross sectional side elevational view of the initial semiconductor substrate shown in FIG. 1 including a semiconductor oxide layer after thermal oxidation.

Referring to FIG. 2, a thermal oxidation process is applied to the top of the semiconductor substrate 14 to produce a semiconductor oxide layer 18, for example, a silicon oxide or germanium oxide layer, on the top of the semiconductor substrate 14. In one embodiment of the present disclosure, the thermal oxidation is a growing process using a Si substrate and oxygen implantation, for example, using either a wet or dry oxidation method. The thermal oxidation that can be employed in the present disclosure includes conditions that are well known to those skilled in the art.

In alternative embodiments, when using a carbon or quartz substrate, a deposit of an oxide is typically used as the oxide cannot be grown as with silicon. Alternatively, an oxide layer may include rare earth metals that are crystalline, or aluminum oxide.

Figure 3:
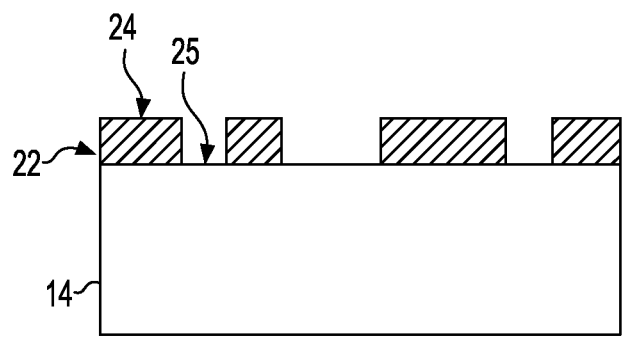
FIG. 3 is a cross sectional side elevational view of the semiconductor substrate shown in FIG. 2 depicting patterning in the semiconductor oxide layer.

Referring to FIG. 3, photolithography and etching are used to pattern the semiconductor oxide layer 18 into a patterned semiconductor oxide layer 22. The photolithography process that can be employed in this disclosure includes applying a photoresist (not shown) to the surface of the semiconductor oxide layer 18, exposing the photoresist to a pattern of radiation, and then developing the pattern into the photoresist utilizing a conventional resist developer. Once the patterning of the photoresist is completed, portions of the semiconductor oxide layer 18 that are covered by the photoresist are protected, while other portions of the semiconductor oxide layer 18 are exposed. The exposed portions of the semiconductor oxide layer that are not protected by the patterned photoresist are removed using a selective etching process.

In one embodiment, a dry etch such as, for example, reactive ion etching, plasma etching, ion beam etching or laser ablation can be used to selectively remove the exposed portions of the semiconductor oxide layer that are not protected by the patterned photoresist. In another embodiment, a wet etch can be used to selectively remove the exposed portions of the semiconductor oxide layer that are not protected by the patterned photoresist. When a wet etch is employed, a chemical etchant selectively removes oxide compared to photoresist material and semiconductor substrate.

Following the removal of the exposed portions of the semiconductor oxide layer, the patterned photoresist is typically stripped from the structure utilizing a conventional resist stripping process such as, for example, ashing.

The foregoing steps of photolithography and etching leaves a patterned semiconductor oxide layer 22 on the upper surface of semiconductor substrate 14. The patterned semiconductor oxide layer 22 includes remaining semiconductor oxide layer that was not removed during the etching process described above. As shown in FIG. 3, the patterned semiconductor oxide layer 22 includes, for example, raised portions 24 and etched portions 25. In some embodiments, the etched portions 25 can have a small amount of semiconductor oxide left in the defined trenches, i.e., etched portions 25 between the raised portions 24, on the semiconductor substrate 14. In other embodiments, no semiconductor oxide is left in the etched portions 25. The patterned semiconductor oxide layer 22 may be developed into electrical components or connections.

Figure 4:
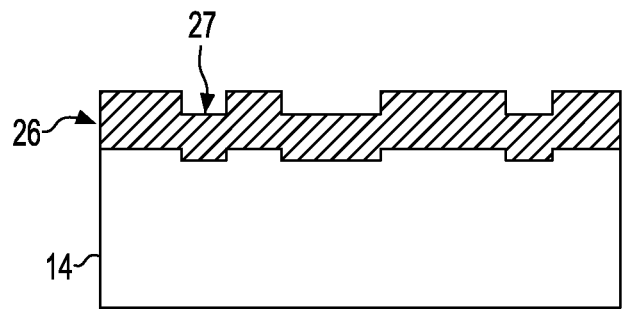
FIG. 4 is a cross sectional side elevational view of the semiconductor substrate shown in FIG. 3 depicting the patterned semiconductor oxide layer after another thermal oxidation which forms a semiconductor oxide layer having features therein.

Referring to FIG. 4, additional semiconductor oxide can be grown on the exposed surfaces of the semiconductor substrate 14 utilizing a second thermal oxidation process. The second thermal oxidation process forms a semiconductor oxide layer that contains features; this layer is referred to hereinafter as "feature layer 26" for short. In the feature layer 26, semiconductor oxide has expanded upward from the patterned semiconductor oxide layer 22 (as shown in FIG. 3), and an oxide layer 27 is formed in the etched portions 25 (or defined trenches) between the raised portions 24; note that the oxide layer 27 also consumes an upper portion of the exposed portions of the semiconductor substrate 14. As shown, feature layer 26 at this point of the method has opposing surfaces that are both non-planar.

Figure 5:
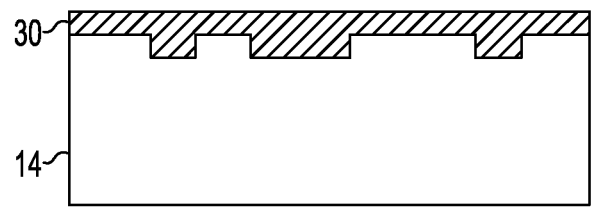
FIG. 5 is a cross sectional side elevational view depicting the semiconductor substrate shown in FIG. 4 after planarization of the semiconductor oxide layer having the features.

Referring to FIG. 5, an oxide chemical-mechanical polishing (CMP) is applied to the exposed non-planar surface of the feature layer 26 shown in FIG. 4, resulting in a planar semiconductor oxide layer 30. The planar semiconductor oxide layer 30 is planar on a top side and has features (i.e., is non-planar) on the side mating with the semiconductor substrate 14.

Figure 6:
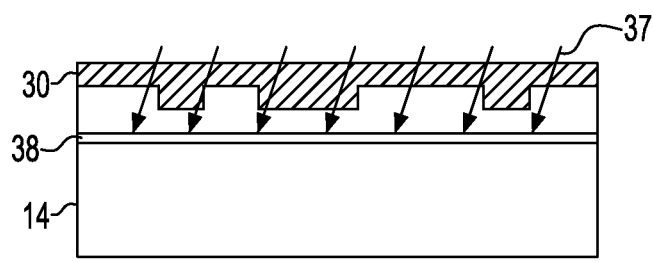
FIG. 6 is a cross sectional side elevational view of the semiconductor substrate shown in FIG. 5 with a hydrogen implant and hydrogen layer within the semiconductor substrate.

Referring to FIG. 6, a technique for wafer splitting includes, a hydrogen (H+) ion implantation 37 which can be performed to create a hydrogen layer 38 beneath the surface of the semiconductor substrate 14. The hydrogen layer 38 bifurcates the semiconductor substrate 14. The hydrogen ion implantation 37 may be performed using a specified energy level and hydrogen dosage to result in a predetermined hydrogen layer depth.

Figure 7:
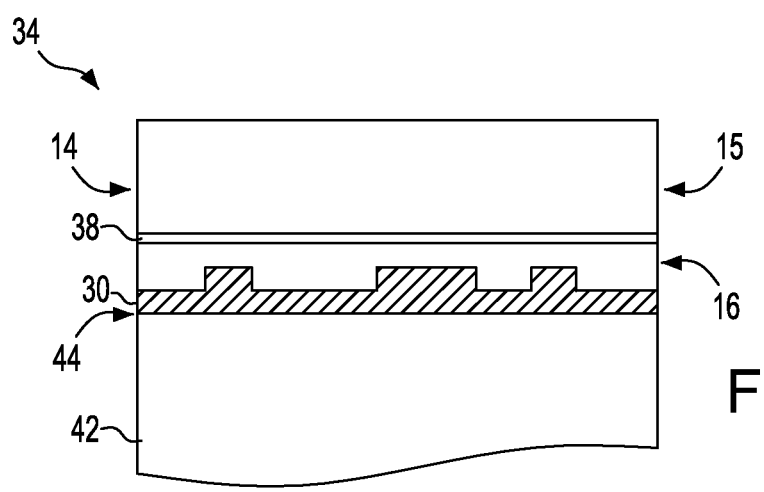
FIG. 7 is a cross sectional side elevational view of the semiconductor substrate shown in FIG. 6 including a bonded handle substrate, and the formed semiconductor structure which includes the semiconductor substrate being inverted.

Referring to FIG. 7, a handle substrate 42 is positioned and bonded over the planar semiconductor oxide layer 30 of FIG. 6, and a resulting planarized semiconductor structure 34 is inverted. Once inverted, the planarized semiconductor structure 34 includes an upper portion 15 of the semiconductor substrate 14 above the hydrogen layer 38, and an active semiconductor layer 16 beneath the hydrogen layer 38 which communicates with the planar semiconductor oxide layer 30. A bond 44 between the planar semiconductor oxide layer 30 and the handle substrate 42 may be an oxide silicon bond. As shown, the non-planar surface of the planar semiconductor oxide layer 30 is in direct contact with a surface of the active semiconductor layer 16.

The handle substrate 42 may include one of the semiconductor materials mentioned above for substrate 14. In one embodiment, the handle substrate 42 and the semiconductor substrate 14 are both comprised of Si. Bonding may occur using any bonding technique which is well known to those skilled in the art.

Figure 8:
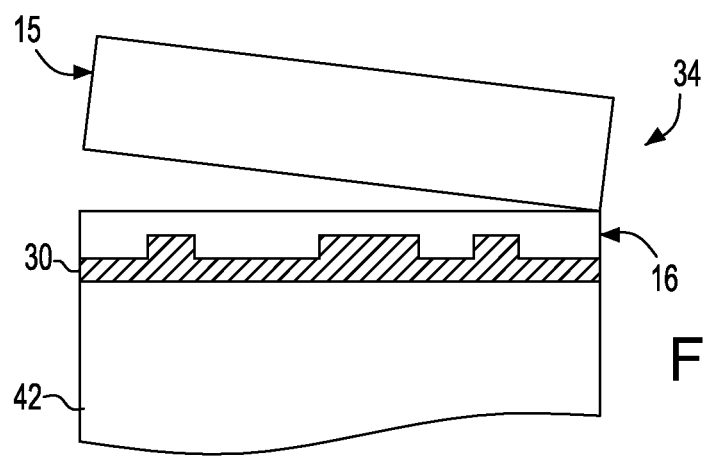
FIG. 8 is a cross sectional side elevational view of the semiconductor structure shown in FIG. 7 depicting splitting the semiconductor substrate at the hydrogen layer.

Referring to FIG. 8, the planarized semiconductor structure 34 is heated, and the structure 34 is split at the hydrogen layer 38 to remove the upper portion 15 of the planarized semiconductor structure 34. The final planarized semiconductor structure 50 is shown in FIG. 9.

Figure 9:
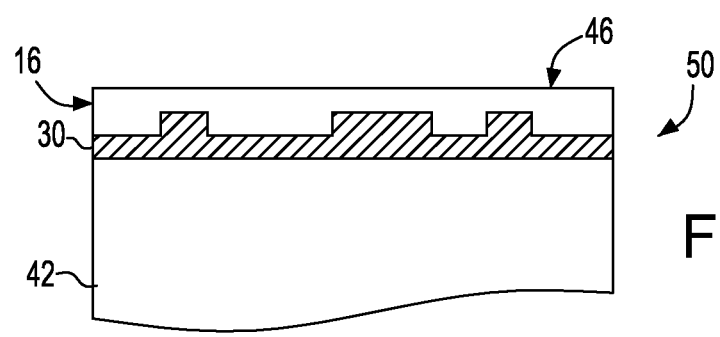
FIG. 9 is a cross sectional side elevational view depicting a planarized semiconductor structure according to an embodiment of the disclosure.

The final planarized semiconductor structure 50 shown in FIG. 9 includes the planar semiconductor oxide layer 30 between the active semiconductor layer 16 of the semiconductor substrate 14, and the handle substrate 42. The final planarized semiconductor structure 50 is planarized at its surface 46 while the features of the planar semiconductor oxide layer 30 are beneath the surface 46 of the final planarized semiconductor structure 50. Moreover, the non-planar surface of the planar semiconductor oxide layer 30 is in direct contact with a surface of the active semiconductor layer 16, while the planar surface of the planar semiconductor oxide layer 30 is in direct contact with an upper surface of the handle substrate 42.

One advantage of the final planarized semiconductor structure 50 is, for example, during a complementary metal-oxide-semiconductor (CMOS) manufacturing procedure, the final planarized semiconductor structure 50 is more easily processed because the features of the oxide layer 30, for example an SiO2 layer, are not exposed to unwanted processing either directly or indirectly. Further, the planar semiconductor oxide layer 30 of the final planarized semiconductor structure 50 is not exposed to accidental damage as if the planar semiconductor oxide layer 30 was exposed. Additionally, the final planarized semiconductor structure 50 includes thin and thick (partially and fully depleted) Silicon on Insulator (SOI), which enables both partially and fully depleted devices on the final planarized semiconductor structure 50.

The present disclosure can further be used with Microelectromechanical systems (MEMS) technology, bipolar devices, and bio sensors.

While the present disclosure has been particularly shown and described with respect to preferred embodiments thereof, it will be understood by those skilled in the art that changes in forms and details may be made without departing from the spirit and scope of the present application. It is therefore intended that the present disclosure not be limited to the exact forms and details described and illustrated herein, but falls within the scope of the appended claims.

What is claimed is:

1. A method for semiconductor manufacturing, comprising:
    forming a semiconductor oxide layer on a top surface of a semiconductor substrate using a first thermal oxidation;
    patterning the semiconductor oxide layer;
    performing a second thermal oxidation of the patterned semiconductor oxide layer to form a semiconductor oxide layer having features;
    planarizing an exposed surface of the semiconductor oxide layer having features to provide a feature-containing semiconductor oxide layer having an entirely planar surface that is opposite a surface containing said features;
    bonding a semiconductor surface of a handle substrate directly to the entirely planar surface of the feature-containing semiconductor oxide layer to form a semiconductor structure containing from bottom to top, said semiconductor substrate, said feature-containing oxide layer and said handle substrate, wherein said feature-containing oxide layer entirely separates said semiconductor substrate from said handle substrate;
    inverting said semiconductor structure to provide an inverted structure of, from bottom to top, said handle substrate, said feature-containing semiconductor oxide layer, and said semiconductor substrate; and
    planarizing an exposed surface of the semiconductor substrate of the inverted structure providing an active semiconductor layer, said feature-containing semiconductor oxide layer is a continuous layer spanning an entire length of the active semiconductor layer and said handle substrate, and wherein an entirety of the feature-containing semiconductor oxide layer is located beneath an exposed surface of the active semiconductor layer, and the feature-containing semiconductor oxide layer is located between the active semiconductor layer and the handle substrate and wherein said surface containing said features is non-planar, located above said entirely planar surface, and is in direct contact with said active semiconductor layer.

2. The method of claim 1, wherein the first thermal oxidation includes implanting oxygen in the semiconductor substrate, the semiconductor substrate being composed of silicon.

3. The method of claim 1, wherein the first thermal oxidation includes a wet oxidation process or a dry oxidation process.

4. The method of claim 1, wherein the patterning of the semiconductor oxide layer includes photolithography and etching.

5. The method of claim 4, wherein the etching includes dry etching or wet etching.

6. The method of claim 1, wherein the planarizing the exposed surface of the semiconductor oxide layer having features comprises an oxide chemical-mechanical polishing (CMP).

7. The method of claim 1, further comprising implanting a hydrogen layer beneath the feature-containing semiconductor oxide layer in the semiconductor substrate prior to inverting, the implanting including specifying an energy level of the implantation, and specifying a dosage of hydrogen resulting in a predetermined hydrogen layer depth in the semiconductor substrate.

8. The method of claim 7, wherein the hydrogen layer bifurcates the semiconductor substrate.

9. The method of claim 1, wherein said exposed surface of the active semiconductor layer is vertically offset from the uppermost surface of the semiconductor oxide layer having said features.

\* \* \* \* \*